United States Patent
Srinivasan et al.

(10) Patent No.: US 10,026,613 B2
(45) Date of Patent: Jul. 17, 2018

(54) UTILIZATION OF ANGLED TRENCH FOR EFFECTIVE ASPECT RATIO TRAPPING OF DEFECTS IN STRAIN-RELAXED HETEROEPITAXY OF SEMICONDUCTOR FILMS

(71) Applicant: Applied Materials, Inc., Santa Clara, CA (US)

(72) Inventors: Swaminathan T. Srinivasan, Pleasanton, CA (US); Fareen Adeni Khaja, San Jose, CA (US); Errol Antonio C. Sanchez, Tracy, CA (US); Patrick M. Martin, Ipswich, MA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/668,059

(22) Filed: Aug. 3, 2017

(65) Prior Publication Data
US 2017/0330750 A1 Nov. 16, 2017

Related U.S. Application Data

(62) Division of application No. 15/195,449, filed on Jun. 28, 2016, now Pat. No. 9,799,531, which is a division
(Continued)

(51) Int. Cl.
*H01L 21/02* (2006.01)
*H01L 21/311* (2006.01)
(Continued)

(52) U.S. Cl.
CPC .... *H01L 21/02658* (2013.01); *H01L 21/0214* (2013.01); *H01L 21/0217* (2013.01);
(Continued)

(58) Field of Classification Search
CPC ............... H01L 21/02019; H01L 21/02658
See application file for complete search history.

(56) References Cited

U.S. PATENT DOCUMENTS 5,124,274 A     6/1992   Ohki et al.
5,844,294 A * 12/1998   Kikuchi ............ H01L 21/76264
                                                                  257/510
(Continued)

FOREIGN PATENT DOCUMENTS

EP       0 486 201 A2    5/1992
WO    2013177576 A1   11/2013

OTHER PUBLICATIONS

PCT Notification of Transmittal of the International Search Report and the Written Opinion of the International Searching Authority for InternationalApplication No. PCT/US2015/021195 dated Jun. 29, 2015; 12 total pages.
(Continued)

*Primary Examiner* — Marc Armand
(74) *Attorney, Agent, or Firm* — Patterson + Sheridan LLP

(57) ABSTRACT

Embodiments of the present disclosure relate to reducing dislocation density in a heteroepitaxial growth film and devices including heteroepitaxial films with reduced dislocation density. According to embodiments of the present disclosure, sidewalls of high aspect ratio trenches may be tilted or angled to allow defects in crystalline material formed in the high aspect ratio trenches to be terminated in the tilted sidewalls, including defects propagating along the length of the high aspect ratio trenches. Embodiments of the present disclosure may be used to reduce defects in heteroepitaxial growth on silicon (Si) for microelectronic applications, such as high mobility channels using Group III-V elements in field effect transistors.

12 Claims, 7 Drawing Sheets

Related U.S. Application Data of application No. 14/661,495, filed on Mar. 18, 2015, now Pat. No. 9,406,507.

(60) Provisional application No. 61/984,902, filed on Apr. 28, 2014.

(51) Int. Cl.
*H01L 29/04* (2006.01)
*H01L 29/06* (2006.01)
*H01L 29/267* (2006.01)

(52) U.S. Cl.
CPC ...... *H01L 21/0254* (2013.01); *H01L 21/0259* (2013.01); *H01L 21/02164* (2013.01); *H01L 21/02381* (2013.01); *H01L 21/02433* (2013.01); *H01L 21/02488* (2013.01); *H01L 21/02513* (2013.01); *H01L 21/02538* (2013.01); *H01L 21/02543* (2013.01); *H01L 21/02546* (2013.01); *H01L 21/311* (2013.01); *H01L 21/31116* (2013.01); *H01L 29/045* (2013.01); *H01L 29/0649* (2013.01); *H01L 29/0684* (2013.01); *H01L 29/267* (2013.01)

(56) References Cited

U.S. PATENT DOCUMENTS

| | | | |
|---|---|---|---|
| 9,406,507 | B2 | 8/2016 | Srinivasan et al. |
| 2005/0003602 | A1 | 1/2005 | Lowrey et al. |
| 2006/0108680 | A1 | 5/2006 | Wu et al. |
| 2007/0026632 | A1* | 2/2007 | Yamamoto ........ H01L 21/76235 438/424 |
| 2007/0045857 | A1 | 3/2007 | Wark et al. |
| 2008/0099785 | A1 | 5/2008 | Bai et al. |

OTHER PUBLICATIONS

Taiwanese Office Action (with attached English translation of the Search Report) for Application No. 104109217; dated Apr. 17, 2017; 5 total pages.

* cited by examiner

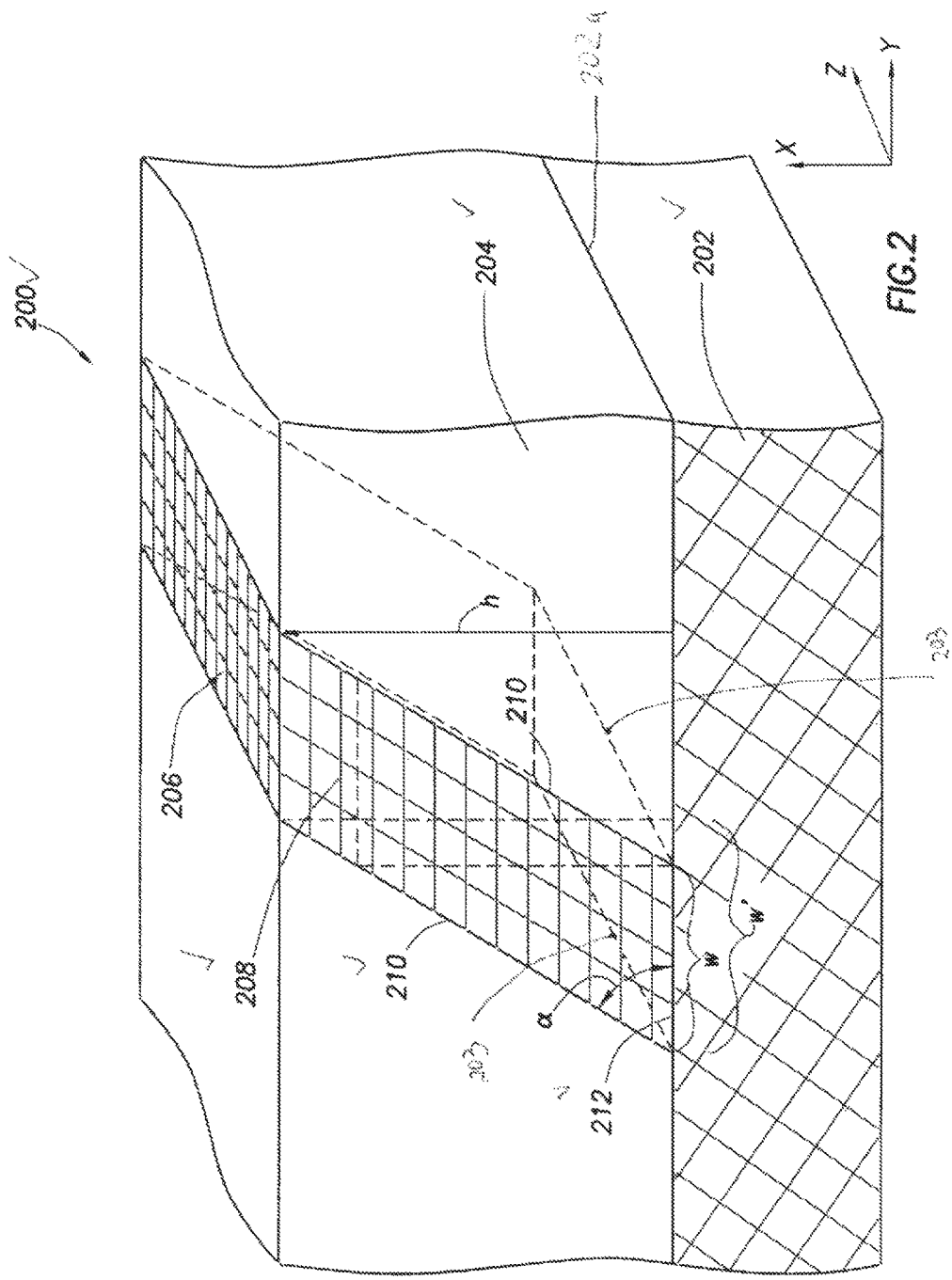

UTILIZATION OF ANGLED TRENCH FOR EFFECTIVE ASPECT RATIO TRAPPING OF DEFECTS IN STRAIN-RELAXED HETEROEPITAXY OF SEMICONDUCTOR FILMS

CROSS-REFERENCE TO RELATED APPLICATIONS

This divisional application claims benefit of U.S. patent application Ser. No. 15/195,449, filed Jun. 28, 2016, which claims benefit of U.S. patent application Ser. No. 14/661,495, filed Mar. 18, 2015, which claims benefit of U.S. Provisional Patent Application No. 61/984,902, filed on Apr. 28, 2014. Each of the aforementioned applications is herein incorporated by reference.

BACKGROUND

Field

Embodiments of the present disclosure relate to heteroepitaxial growth of materials with high lattice mismatch. More particularly, embodiments of the present disclosure relate to reducing dislocation density in a heteroepitaxial growth film and devices including heteroepitaxial films with reduced dislocation density.

Description of the Related Art

Heteroepitaxy, a crystalline film growth on a crystalline substrate or film of a different material, has many practical applications. For example, germanium (Ge) heteroepitaxy on silicon (Si) is used as p-channel in field effect transistors (FET). However, heteroepitaxy films are prone to defects, such as dislocations, anti-phase boundaries, and stacking faults, due to the lattice mismatch between the two different crystalline materials.

Aspect ratio trapping (ART) has been used to reduce defects in heteroepitaxy films. In aspect ratio trapping, a crystalline material grows in deep, narrow trenches, i.e. high aspect ratio trenches, so that some dislocations caused by lattice mismatch may terminate at the trench walls, thus, trapped within the high aspect ratio trenches rather than running up into active area of the crystalline material.

However, conventional aspect ratio trapping cannot terminate dislocations generated along the length of the narrow trenches. FIG. 1 schematically illustrates a structure 100 of conventional aspect ratio trapping. A narrow trench 106 is formed in a dielectric layer 104 over a crystalline material 102 so that a heteroepitaxy film may be formed in the narrow trench 106. The narrow trench 106 is narrow along the x direction and extends in length along the z direction. The crystalline material 102 exposed at a bottom 110 of the narrow trench 106 serves as the seed structure for the epitaxial growth of a guest material in the narrow trench 106. During heteroepitaxy, dislocations caused by mismatch between the lattices of the guest material and the crystalline material 102 generate from the bottom 110 and expand along all directions. The dislocations expanding along x-y plane, i.e. perpendicular to the length of the narrow trench 106, may run into sidewalls 108 and be terminated. However, dislocations expanding along x-z plane, i.e. parallel to the length of the narrow trench 106, may run up to a top 112 of the narrow trench 106 and negatively affect the intended active area.

Therefore, there is a need for methods and structures with reduced defects in heteroepitaxy film.

SUMMARY

Embodiments of the present disclosure relate to heteroepitaxial growth of materials with high lattice mismatch. More particularly, embodiments of the present disclosure relate to reducing dislocation density in a heteroepitaxial growth film and devices including heteroepitaxial films with reduced dislocation density.

One embodiment provides a device including a first crystalline material; and a non-crystalline layer formed over the first crystalline material. An angled trench is formed through the non-crystalline layer so that the first crystalline material is at a bottom of the angled trench. The device further includes a second crystalline material formed in the angled trench by epitaxial growth. The first crystalline material and the second crystalline material have mismatched lattice dimensions. A projection of a sidewall of the angled trench on a top surface of the first crystalline material is longer than the bottom of the angled trench.

Another embodiment of the present disclosure provides a method for forming a semiconductor device. The method includes forming a non-crystalline layer over a first crystalline material, forming an angled trench through the non-crystalline layer to expose a portion of the first crystalline material at a bottom of the angled trench, and forming a second crystalline material from the bottom of the angled trench by epitaxial growth to fill the angled trench, wherein the first and second crystalline materials have mismatched lattice dimensions.

Another embodiment of present disclosure provides a method for forming a semiconductor device. The method includes forming a dielectric layer over a silicon-containing crystalline substrate and forming an angled trench through the dielectric material to expose a portion of the silicon containing crystalline substrate at a bottom of the angled trench. An angle between sidewalls of the angled trench and a top surface of the silicon containing crystalline substrate is less than $$\tan^{-1}\frac{h}{w},$$

wherein h represents a thickness of the dielectric layer, and w represents a width of the angled trench along the top surface of the silicon containing crystalline substrate. The method further includes etching the exposed silicon containing crystalline substrate at the bottom of the angled trench to produce a surface along (111) crystal plane direction, and forming a crystalline material comprising a Group III element and a Group V element in the angled trench by epitaxial growth.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2 schematically illustrates an angled trench for heteroepitaxy according one embedment of the present disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
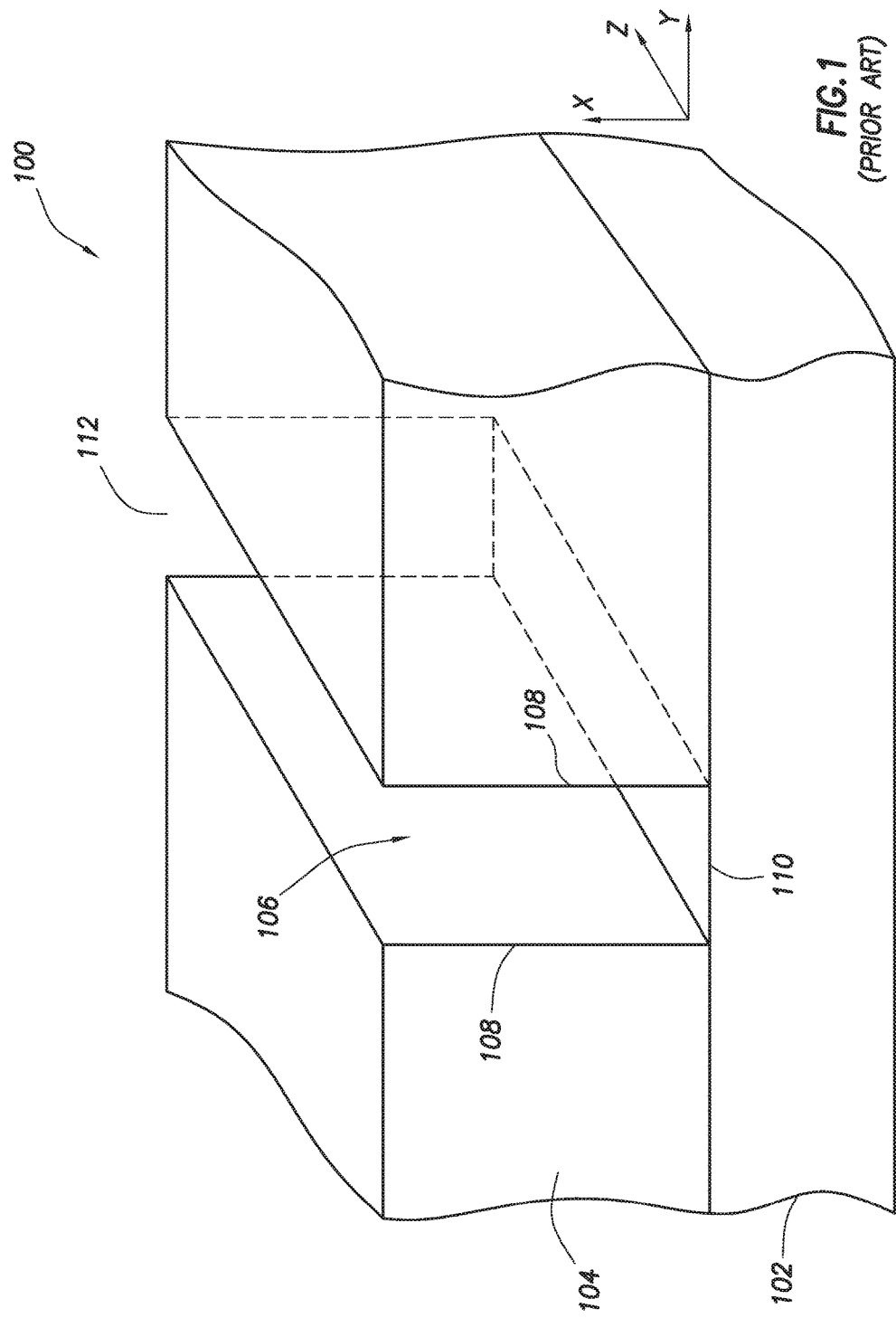
FIG. 1 is a schematic illustration of a structure for conventional heteroepitaxy by aspect ratio trapping.

According to embodiments of the present disclosure, sidewalls of high aspect ratio trenches may be tilted or angled to allow defects at crystalline material formed in the high aspect ratio trenches to be terminated in the tilted sidewalls, including defects propagating along the length of the high aspect ratio trenches. Embodiment of the present disclosure may be used to reduce defects in any crystalline films formed by heteroepitaxy. For example, embodiments of the present disclosure may be used to reduce defects in heteroepitaxial growth on silicon (Si) for microelectronic applications, such as high mobility channels using Group III-V elements in field effect transistors. Embodiments of the present disclosure may also be used in forming other epitaxial films, such as gallium nitride (GaN) films formed on sapphire, aluminum gallium indium phosphide (AlGaInP) film formed on gallium arsenide (GaAs) or on single crystalline CVD diamond or on iridium.

FIG. 2 schematically illustrates a structure 200 having an angled trench 206 for heteroepitaxy according one embodiment of the present disclosure. The structure 200 includes a crystalline material 202. The crystalline material 202 may have a top surface 202a along the y-z plane. A non-crystalline layer 204 may be formed on the top surface 202a of the crystalline material 202. An angled trench 206 is formed in the non-crystalline layer 204 to expose a portion of the top surface 202a of the crystalline material 202. The angled trench 206 is defined by sidewalls 210 and a bottom 212 which is a portion of the top surface 202a. The sidewalls 210 and the bottom 212 meet at edges 203. For convenience of discussion, the angle α of the angled trench 206 is the angle between the sidewalls 210 and the bottom 212, the width w of the angled trench 206 is defined by the distance between the edges 203, and the height h of the angled trench 206 is defined by the thickness of the non-crystalline material 204. A guest crystalline material 208 is formed in the angled trench 206 from the bottom 212 and fills the angled trench 206. The guest crystalline material 208 and the crystalline material 202 are different in lattice dimensions. The mismatch of the lattice dimensions between the crystalline material 202 and the crystalline material 208 causes defects, such as dislocations, anti-phase boundaries, and stacking faults, to form in the guest crystalline material 208. The angle α, width w, and height h of the angled trench 206 may be selected such that defects initiated from the bottom 212 of the angled trench 206, where the crystalline material 202 interfaces with the guest crystalline material 208, may be terminated on the sidewalls 210 of the angled trench 206.

In one embodiment, the angle α is set so that the defects extending in planes parallel to the x-z plane along the length of the angled trench 206 terminate on the sidewall 210 of the angled trench. Particularly, the angle α and the width w are selected so that a projection w' of the sidewall 210 on the y-z plane is longer than the width w of the angled trench 206, $$w \leq w' = \frac{h}{\tan \alpha} \quad \text{(eq. 1)}$$

or $$\alpha \leq \tan^{-1} \frac{h}{w}. \quad \text{(e.g. 2)}$$

In one embodiment, the aspect ratio, ratio of height over width h/w, is selected so that defects generated from the bottom 212 and prorogating along planes parallel to the x-y plane may terminate on the sidewalls 210. It should be noted that the ratio of height over width h/w is unitless.

In one embodiment, the height h of the angled trench 206 may be about 100 nanometers or less. The width w of the angled trench 206 may be between about 20 nanometers to about 40 nanometers. The angle α of the angled trench 206 may be between about 11 degrees to about 45 degrees. In one embodiment, the angle α of the angled trench 206 may be about 30 degrees.

The crystalline material 202 may be a substrate formed by a crystalline material, or a crystalline layer formed on a substrate. In one embodiment, the crystalline material 202 may be a silicon-containing substrate including germanium (Ge), carbon (C), boron (B), phosphorous (P) or other known elements that may be co-grown, doped, and/or associated with silicon materials.

The non-crystalline material 204 may a dielectric material including one or more of silicon nitride (SiN), silicon dioxide ($SiO_2$), silicon oxynitride (SiON) or other suitable materials that may be used to form a dielectric layer.

The guest crystalline material 208 may be formed by heteroepitaxy from the exposed crystalline material 202 on the bottom 212 of the angled trench 206. The guest crystalline material 208 may include one of a binary or ternary Group III-V element. The Group III element may include gallium (Ga), aluminum (Al) and indium (In). The Group V element may include nitrogen (N), phosphorus (P), and arsenic (As).

The structure 200 may be used in forming any suitable devices where heteroepitaxy trench material is desired, such as field effect transistors and optoelectronic devices.

Figure 3A:
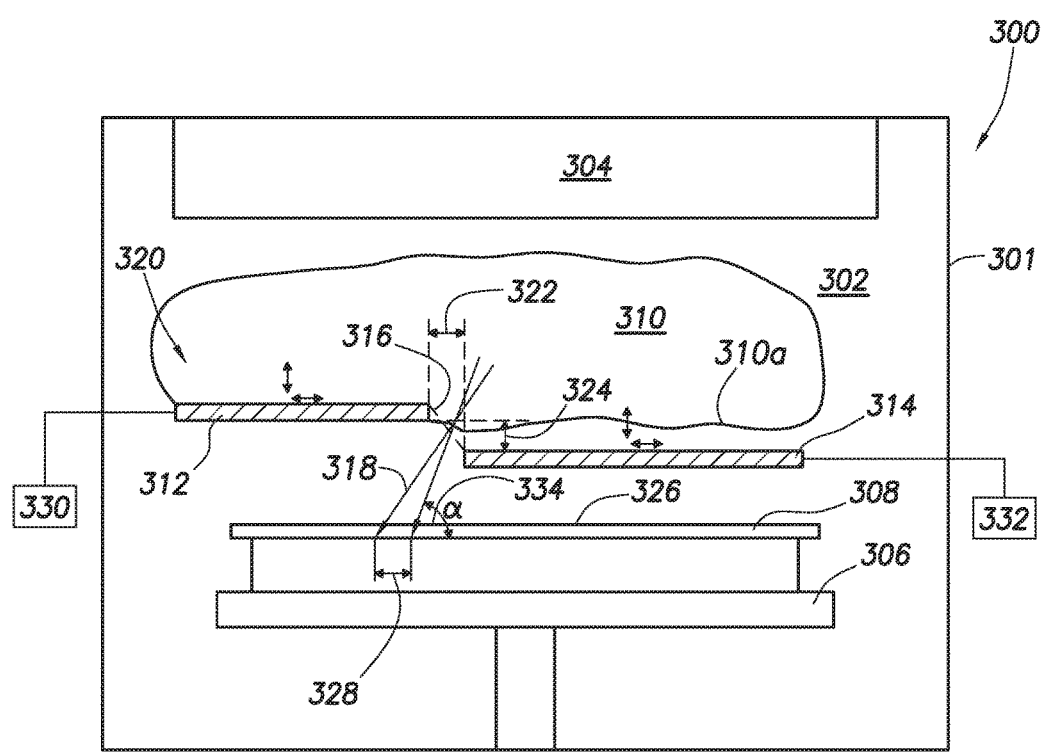
FIG. 3A is a schematic sectional view of a process chamber for forming angled trench according to one embodiment of the present disclosure.

The angled trench 206 of the structure 200 may be formed by a directional etching process. In one embodiment, the angled trench 206 may be formed by modifying an incident angle of a plasma and directing the modified plasma to a substrate. FIG. 3A is a schematic sectional view of a plasma process chamber 300 for forming angled trenches according to one embodiment of the present disclosure. The plasma process chamber 300 includes a chamber body 301 defining a process volume 302. A substrate support 306 is disposed in the process volume 302 to support a substrate 308 during operation. The plasma process chamber 300 further includes a plasma source 304 to generate and maintain a plasma 310 in the process volume 302 above the substrate 308.

The plasma process chamber 300 further includes an insulating modifier 320 to modify an incident angle 322 of the plasma 310 before directing the plasma 310 to the substrate 308. In one embodiment, the insulating modifier 320 may include two isolator plates 312, 314. The two isolator plates 312 and 314 are positioned so that a gap 316 is formed in between. In one embodiment, the two isolator plates 312 may be disposed at different horizontal levels so that the gap 316 includes a horizontal element 322 along the direction parallel to the substrate surface 326 and a vertical element 324 perpendicular to the substrate surface 326. The gap 316 of the insulating modifier 320 is positioned near the plasma sheath 310a close to the substrate 308. The gap 316 modifies an electric field within the plasma sheath 310a to control a shape of a boundary between the plasma 310 and the plasma sheath 310a. Ions stream 318 from the plasma 310 that are attracted to the substrate 308 from the gap 316 strike the substrate 308 at an angle 334.

The angle 334 of the ion stream 318 enables formation of angled trenches on a process band 328 on the substrate 308. The angle 334 is similar to the angle of the angled trench being formed. The angle 334 may be tuned by adjusting the vertical element 324 and the horizontal element 322 of the gap 316. In one embodiment, actuators 330 and 332 may be connected to the isolator plates 312, 314 to move the isolator plates 312, 314 respectively to adjust the vertical elements 324 and horizontal element 322 of the gap 316.

The substrate 308 and the insulating modifier 320 may be moved relative to each other to move the process band 328 thus processing the entire substrate 308 by scanning the process band 328 over the substrate 308. In one embodiment, the actuators 330 and 332 may also move the isolator plates 312, 314 relative to the substrate 308 to move the process band 328.

Figure 3B:
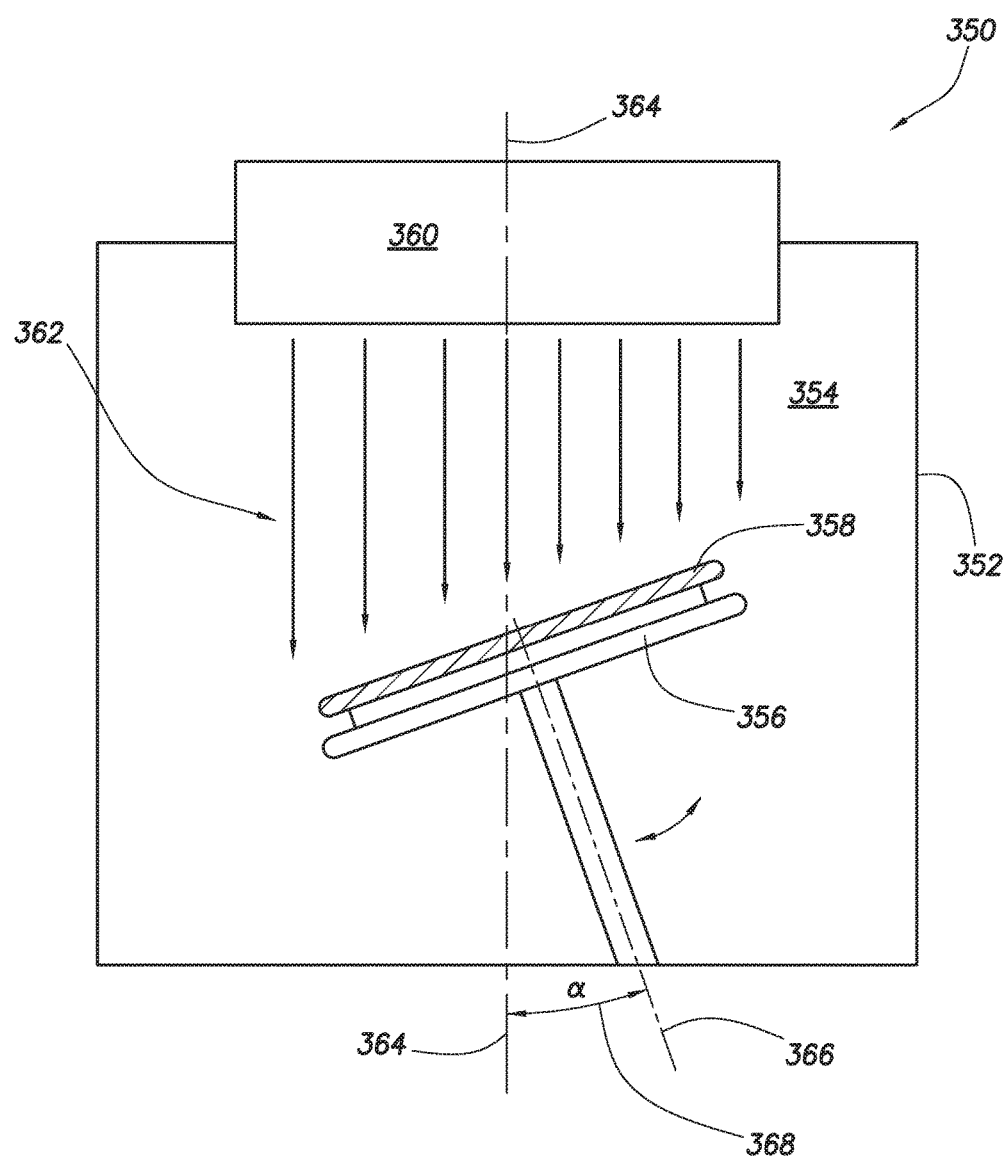
FIG. 3B is a schematic sectional view of a process chamber for forming angled trench according to another embodiment of the present disclosure.

Alternatively, the angled trench 206 may be formed by an ion beam etching method, for example, ion beam etching (IBE), reactive ion beam etching (RIBE), and chemical assisted ion beam etching (CABIE). FIG. 3B is a schematic sectional view of a process chamber 350 for forming angled trench according to another embodiment of the present disclosure. The process chamber 350 may include a chamber body 352 defining a process region 354. A substrate support 356 positions a substrate 358 in the process region 354. The process chamber 350 further includes an ion beam source 360. The ion beam source 360 directs a combed ion beam 362 toward the substrate 358 in the process region 352. The ion beam 362 may be combed along a central axis 364. The substrate support 356 positions the substrate 358 at a direction perpendicular to a substrate axis 366. The substrate axis 366 is at an angle 368 relative to the central axis 364 of the ion beam 362 so that the ion beam 362 impinges the substrate 358 at the angle 368 to create angled trenches.

FIGS. 4A-4D schematically depict formation of a device 400 having a heteroepitaxy film in an angled trench according to one embodiment of the present disclosure. In one embodiment, the device 400 may be part of a planar metal-oxide-semiconductor field effect transistor (MOSFET). Alternatively, the device 400 may be part of a FinFET, i.e. a field effect transistor having a thin fin connecting the source and the drain. The channel between the source and drain of MOSFET or the thin fin of FinFET may be formed by heteroepitaxy according to embodiments of the present disclosure.

Figure 4A:
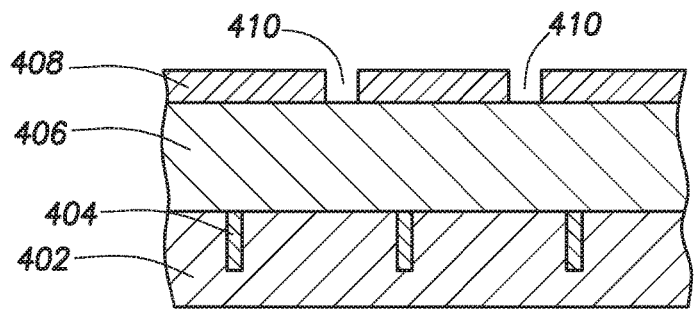
FIGS. 4A-4D schematically depict formation of a device having a heteroepitaxy film in an angled trench according to one embodiment of the present disclosure.

As shown in FIG. 4A, a substrate 402 having a dielectric layer 406 formed thereon. The substrate 402 is formed from a crystalline material. The substrate 402 may be a silicon substrate or a silicon substrate having germanium (Ge), carbon (C), boron (B), phosphorous (P) or other known elements that may be co-grown, doped, and/or associated with silicon materials. In one embodiment, shallow trench isolation (STI) 404 may be formed in the substrate 402 to provide isolation between neighboring devices. The shallow trench isolation 404 may be formed from silicon oxide.

The dielectric layer 406 may include one or more of silicon nitride (SiN), silicon dioxide ($SiO_2$), silicon oxynitride (SiON) or other suitable materials that may be used to form a non-crystalline dielectric layer.

A trench pattern 410 may be formed in a mask layer 408 over the dielectric layer 406. The trench pattern 410 may be used to form angled trenches according to embodiments of the present disclosure. The mask layer 408 may be a photoresist layer or a hardmask layer. The mask layer 408 may be formed from photoresist, silicon oxide, silicon nitride, silicon on glass (SOG), conformal carbon layer, and other suitable material.

Figure 4B:
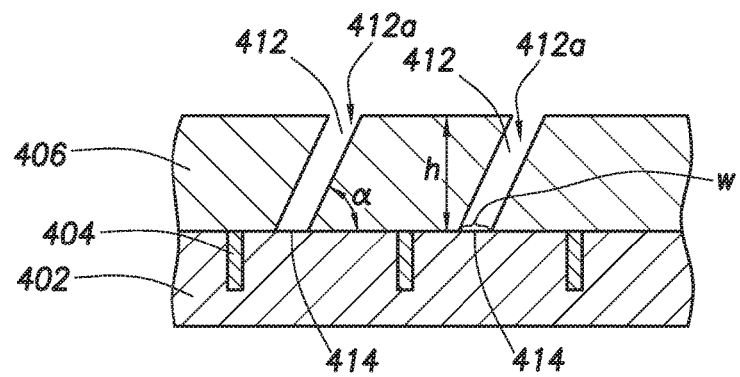

In FIG. 4B, angled trenches 412 are formed through the dielectric layer 406 to expose a portion of the substrate 402 at a bottom surface 414 of the angled trenches 412. The crystalline structure on the bottom surface 414 may serve as seeds for epitaxy growth in the angled trench 412. The mask layer 408 may be removed after formation of the angled trench 412.

The angled trench 412 may be formed by dry etching, for example by apparatus and methods described in FIG. 3A or FIG. 3B above. In one embodiment, plasma or ion beam of etch gas may be directed to the substrate 402 to form the angled trench 412. The etch gas may include $SF_6$, $C_3F_8$ $CF_4$, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $AsF_5$, $PF_3$, $PF_5$, or combinations thereof.

According to embodiments of the present disclosure, the aspect ratio and the angle α of angled trench 412 are set so that the defects from extending to an upper portion 412a of the angled trench 412. In one embodiment, the angle α is less than $$\tan^{-1}\frac{h}{w},$$

wherein h is the thickness of the dielectric layer 406 or height of the angled trench 412, and w is width of the angled trench 412. In one embodiment, the height of the angled trench 412 may be about 100 nm or less, and the width w of the angled trench 412 may be between about 20 nanometers to about 40 nanometers. The angle α of the angled trench 412 may be between about 11 degrees to about 45 degrees. In one embodiment, the angle α of the angled trench 412 may be about 30 degrees.

Figure 4C:
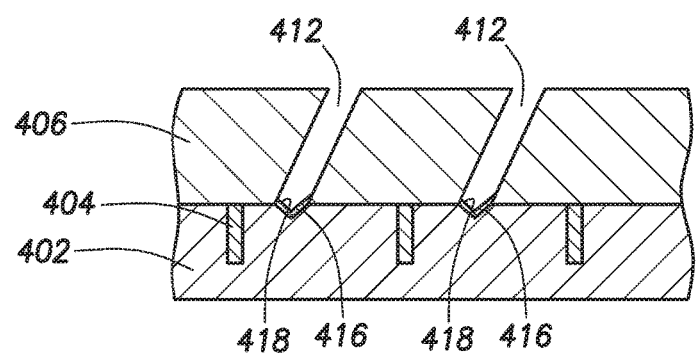

In FIG. 4C, an additional etching may be performed to the substrate 402 to expose surfaces with crystal plane orientation that is more desirable for epitaxial growth. For example, for silicon crystal, the (111) crystal plane orientation has a tighter packing density and are easier to grow an epitaxial film thereon. Since most common silicon substrates are with a (100) crystal plane orientation, the bottom surface 414 of the angled trench 412 are most likely to have a (100) crystal plane orientation. As shown in FIG. 4C, a v-groove 416 may be etched to the substrate 402 to produce surfaces with a (111) crystal plane orientation. The v-groove 416 may be formed by any suitable etch process, such as wet or dry etch methods, or plasma assisted etch methods.

In one embodiment, a seed layer 418 may be formed on the v-groove 416. The seed layer 418 may include material having the ability to attain good coverage of the v-groove 416 having surfaces with a (111) crystal plane orientation.

In one embodiment, when Group III-V crystalline is to be formed in the angled trench 412, the seed layer 418 may include at least one of a Group III element or a Group V element. In one embodiment, the Group III element may include gallium (Ga) or aluminum (Al) and the Group V element may include arsenic (As). One or more Group III or Group V source materials may be used for forming the seed layer 418. The source materials may be metal organic precursors or the like. Exemplary Group III and Group V source materials may include tertiary butyl phosphorous, tertiary butyl arsenic, triethyl antimony, trimethyl antimony, triethyl gallium, trimethyl gallium, triethyl indium, trimethyl indium, indium chloride, indium phosphide, gallium chloride, trimethylaluminum, or organophosphorous compounds. The seed layer 418 may be formed by any suitable deposition method, such as reduced pressure chemical vapor deposition (CVD), epitaxial deposition, or any other suitable deposition method.

Figure 4D:
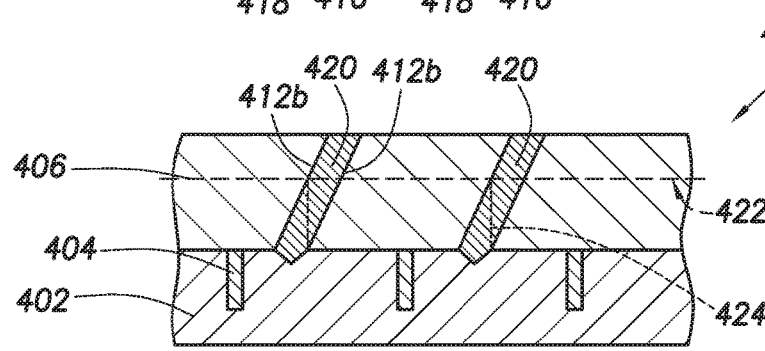

In FIG. 4D, a crystalline material 420 is formed in and fills up the angled trench 412. The crystalline material 420 may be formed by epitaxy deposition. In one embodiment, the crystalline material 420 may include one of a binary or ternary Group III-V material. In one embodiment, the crystalline material 420 may include indium, gallium, and arsenic.

In one embodiment, the composition of the crystalline material 420 may change during deposition. For example, the molar ratio of the binary or ternary Group III-V elements may be set to reduce defect generation at an early stage of filling the angled trench 412 and set to provide desirable device properties, such as improved mobility, at a later stage of filling the angle trench 412.

As shown in FIG. 4B, vertical line 424 schematically illustrates a direction along which defects caused by the lattice mismatch would prorogate in the plane parallel to length (into the paper) of the angled trench 412. The vertical line 424 intersects with sidewalls of the angled trench 412 indicating that the defects are terminated at the sidewalls 412b of the angled trench 412. Horizontal line 422 indicates the highest level the defects can reach. In other words, the crystalline material 420 above the horizontal line 422 may be free of defects originated from lattice mismatch. In one embodiment, the crystalline material 420 below the horizontal line 422 may include $In_{0.3}Ga_{0.7}As$ (molar ratio) to minimize defects and the crystalline material 420 above the horizontal line 422 may include $In_{0.53}Ga_{0.47}As$ (molar ratio) for improved mobility.

Additional structures may be added to the device 400 so that the crystalline material 420 above the horizontal line 422 functions as the operating region.

Figure 5:
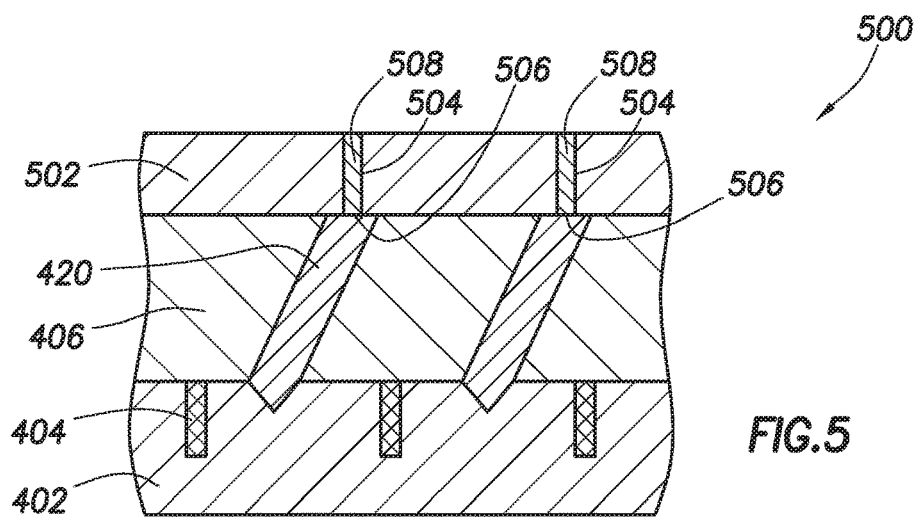
FIG. 5 schematically depicts formation of a replacement epitaxy wire according to one embodiment of the present disclosure.

Alternatively, as shown in FIG. 5, additional crystalline material may be formed from the crystalline material 420 to create operating region for the target device. A dielectric material 502 may be formed over the dielectric material 406 and the crystalline material 420, probably after a chemical mechanical polishing process. The dielectric material 502 may be silicon oxide, silicon nitride or other suitable material. Narrow trenches 504 may be formed through the dielectric material 502 to expose a portion of the crystalline material 420 at a bottom surface 506. The narrow trenches 504 are substantially vertical and aligned with the angled trenches 412. The narrow trenches 504 are narrower than the angled trenches 412. A channel material 508, having the substantially the same lattice dimension as the crystalline material 420, is then formed in the narrow trenches 504 from the crystalline material 420. The channel material 508 may be substantially free of stacking faults, threading dislocations and other defects. In one embodiment, the dielectric material 503 may have a thickness of about 60 nm or less. The narrow trenches 504 may have a width of between about 5 nm to about 10 nm.

Figure 6A:
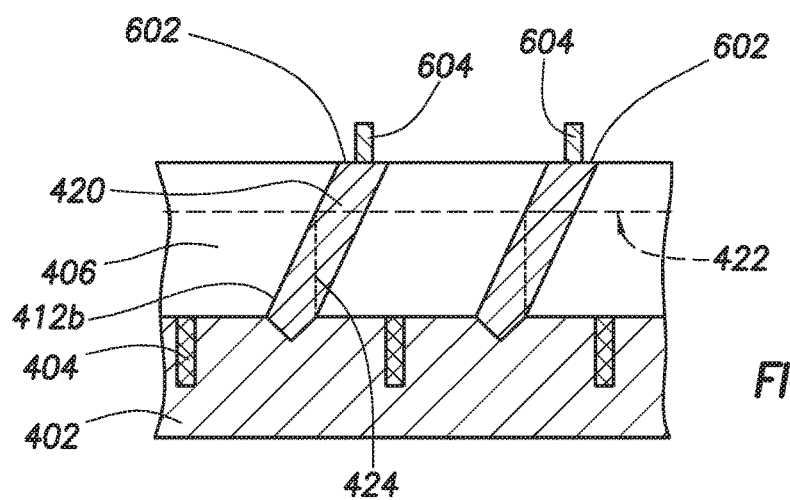
FIGS. 6A-6B schematically depict formation of an epitaxy wire by etching back according to one embodiment of the present disclosure.
Figure 6B:
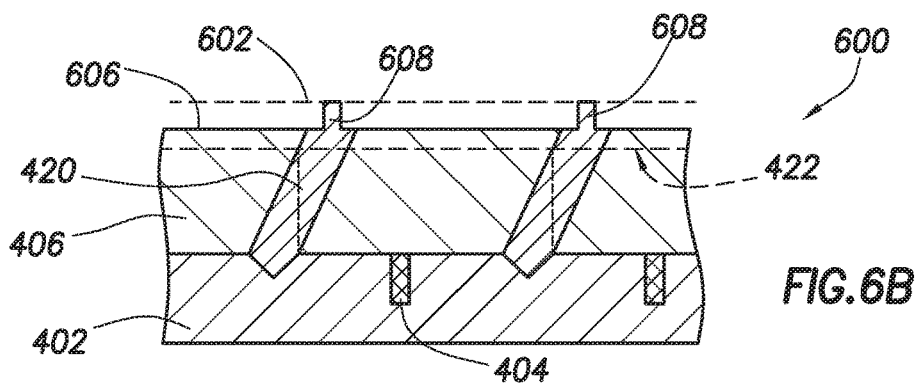

In another embodiment, as shown in FIGS. 6A-6B, channel material may be formed by etching back the crystalline material 420 in the angled trench 412 to form a device 600. Following a chemical mechanical polishing to expose a planar surface 602 of the dielectric material 406 and the crystalline material 420. A mask 604 overlapping with a narrow stretch of the angled trench 412 may be formed over the planar surface 602.

As shown in FIG. 6B, an etch process performed to form channel material 608 in an upper portion of the crystalline material 420. In one embodiment, the channel material 608 may be formed by an anisotropic wet etch. For example, an anisotropic wet etch solution, such as sulfuric acid ($H_2SO_4$) and hydrogen peroxide ($H_2O_2$), or citric acid ($C_6H_8O_7$) and hydrogen peroxide ($H_2O_2$), may be provided to the exposed top surface 602. After the etch process, the channel material 608 may extend over a newly exposed planar surface 606. The planar surface 606 may be above the horizontal line 422 so that the channel material 608 is formed from the portion of the crystalline material 420 that is substantially free of defects from lattice mismatch.

Figure 7:
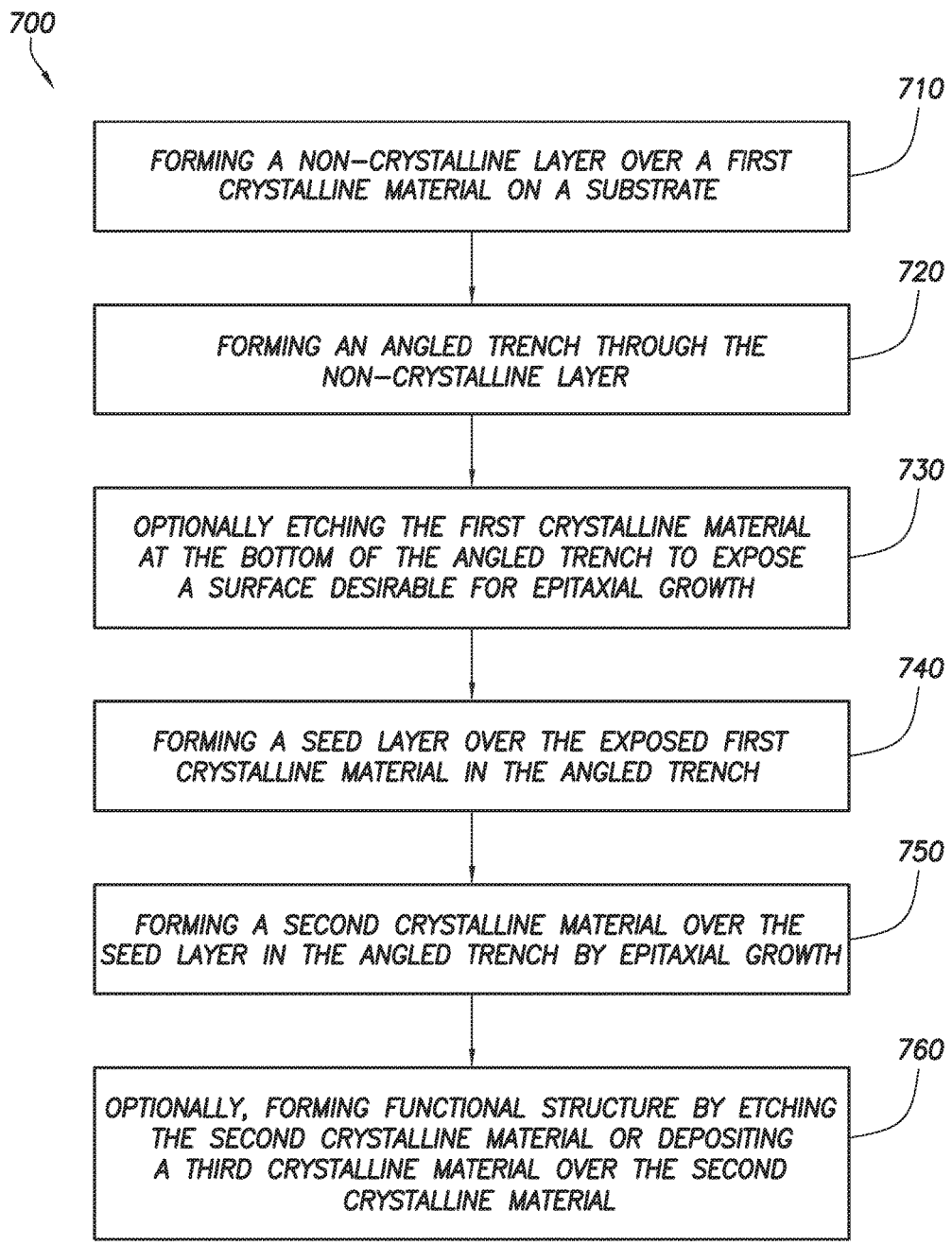
FIG. 7 is a flow chart of a method of heteroepitaxy growth according to one embodiment of the present disclosure.

FIG. 7 is a flow chart of a method 700 for heteroepitaxy growth according to one embodiment of the present disclosure. The method 700 may be used to form devices including angled trenches according to the present disclosure.

In box 710, a non-crystalline layer may be formed over a first crystalline material. The first crystalline material may be a crystalline substrate or a crystalline layer on a substrate. For example, as shown in FIG. 2, the non-crystalline material 204 is formed on the crystalline material 202. In one embodiment, the first crystalline material may be silicon or doped silicon, and the non-crystalline material may be a dielectric material.

In box 720, an angled trench may be formed through the non-crystalline layer and expose a portion of the first crystalline material at a bottom of the angled trench. For example, as shown in FIG. 2, the angled trench 206 is formed in the non-crystalline layer 204.

The angled trench provides boundaries for crystalline growth, such as epitaxial growth, from the exposed portion of the first crystalline material. The angle of the angled trench is set so that defects, that are originated from the bottom of the angled trench during crystal growth and propagate along the planes in the length of the angled trench, would terminate at the tilted non-crystalline sidewalls of the angled trench. In one embodiment, a projection of the sidewall of the angled trench on a top surface of the first crystalline material is longer than the bottom of angled trench. Additionally, the angled trench may be a narrow trench with a high aspect ratio so that defects, that are originated from the bottom of the angled trench and propagate in planes along a width of the angled trench, would terminate at the sidewalls of the angled trench.

The angled trench may be formed by any suitable etching methods. In one embodiment, the angled trench may be formed by an angled ion beam generated by modifying a plasma sheath as shown in FIG. 3A. In another embodiment, the angled trench may be formed by positioning the substrate at an angled position relative to an ion beam source, as shown in FIG. 3B.

In box 730, an optional etching may be performed to the bottom of the angled trench to expose a surface in the first crystalline material that is desirable for crystalline growth. For example, as shown in FIG. 4C, a v-groove may be formed in the bottom of the angled trench to expose crystal surfaces with (111) crystal plane orientation. A wet etching method may be used to perform the optional etching.

In box 740, a seed layer may be formed from the bottom surface of the angled trench for further epitaxial growth. The seed layer may include material having the ability to attain good coverage of the exposed surface of the first crystalline material.

In box 750, a second crystalline material may be formed in the angled trench by epitaxial growth. In one embodiment, the first and second crystalline materials have different lattice dimensions and defects may generate in the second crystalline material during formation because of the lattice mismatch. As discussed in box 720, the sidewalls of the angled trench are positioned to catch and terminate defects caused by lattice mismatch. As a result, the second crystalline material near a top portion of the angled trench is substantially defect free, thus, desirable for use as a functional structure, such as a fin in FinFET, in semiconductor.

Optionally, a functional structure may be formed by additional process from the second crystalline material in the angled trench as described in box 750. In box 760, a functional structure may be formed by either etching the second crystalline material or depositing a third crystalline material over the second crystalline material. In one embodiment, the functional structure may be a vertical fin or nano wire that is narrower than the second crystalline material in the angled trench to provide desirable function in the target device. In one embodiment, the top portion of the second crystalline material may be etched back to form the narrower functional structure, for example as shown in FIGS. 6A-6B. In another embodiment, a narrower vertical trench may be formed over the second crystalline material. A third crystalline material is subsequently formed in the narrower vertical trench as the functional structure, for example as shown in FIG. 5.

Even though embodiments of the present disclosure are discussed above in association with manufacturing epitaxial fins in FinFET, embodiments of the present disclosure may be used to form any applicable structures in any suitable devices. For example, embodiments of the present disclosure may be used to for forming nanowire—which may be used in next generation devices after FinFETs. Nanowires may be formed using angled aspect ratio trapping according to embodiments discussed above with additional processes.

While the foregoing is directed to embodiments of the present disclosure, other and further embodiments of the disclosure may be devised without departing from the basic scope thereof, and the scope thereof is determined by the claims that follow.

The invention claimed is:

1. A method for forming a semiconductor device, comprising:

forming a dielectric layer over a silicon containing crystalline substrate;

forming an angled trench through the dielectric material to expose a portion of the silicon containing crystalline substrate at a bottom of the angled trench, wherein an angle between sidewalls of the angled trench and a top surface of the silicon containing crystalline substrate is less than $$\tan^{-1}\frac{h}{w},$$

h represents a Height of the dielectric layer, and w represents a width of the angled trench along the top surface of the silicon containing crystalline substrate;

etching the exposed silicon containing crystalline substrate at the bottom of the angled trench to produce a surface along (111) crystal plane direction; and forming a crystalline material comprising a Group III element and a Group V element in the angled trench by epitaxial growth.

2. The method of claim 1, wherein forming the angled trench comprises:

generating a plasma over the substrate; and modifying a sheath of the plasma to generate an angled ion stream from the sheath and directing the angled ion stream toward the substrate.

3. The method of claim 1, wherein the etching the exposed silicon containing substrate at the bottom of the angled trench is a wet etching.

4. The method of claim 1, wherein the height of the angled trench is less than or equal to 100 nanometers.

5. The method of claim 1, wherein the width of the angled trench is between about 20 nanometers and about 40 nanometers.

6. The method of claim 1, wherein the angle of the angled trench is between about 11 degrees and about 45 degrees.

7. The method of claim 1, wherein the angle of the angled trench is about 30 degrees.

8. A method for forming a semiconductor device, comprising:

forming a dielectric layer over a silicon containing crystalline substrate;

forming an angled trench through the dielectric material by generating a plasma over the substrate, modifying a sheath of the plasma to generate an angled ion stream from the sheath, and directing the angled ion stream toward the substrate to expose a portion of the silicon containing crystalline substrate at a bottom of the angled trench, wherein an angle between sidewalls of the angled trench and a top surface of the silicon containing crystalline substrate is less than $$\tan^{-1}\frac{h}{w},$$

h represents a height of the dielectric layer, and w represents a width of the angled trench along the top surface of the silicon containing crystalline substrate;

wet etching the exposed silicon containing crystalline substrate at the bottom of the angled trench to produce a surface along (111) crystal plane direction; and forming a crystalline material comprising a Group III element and a Group V element in the angled trench by epitaxial growth.

9. The method of claim 8, wherein the height of the angled trench is less than or equal to 100 nanometers.

10. The method of claim 8, wherein the width of the angled trench is between about 20 nanometers and about 40 nanometers.

11. The method of claim 8, wherein the angle of the angled trench is between about 11 degrees and about 45 degrees.

12. The method of claim 8, wherein the angle of the angled trench is about 30 degrees.

\* \* \* \* \*